(12) United States Patent
Wu

(10) Patent No.: US 11,699,594 B2
(45) Date of Patent: Jul. 11, 2023

(54) PREPARATION METHOD FOR ACCURATE PATTERN OF INTEGRATED CIRCUIT

(71) Applicant: Etownip Microelectronics (Beijing) Co., LTD., Beijing (CN)

(72) Inventor: Hanming Wu, Beijing (CN)

(73) Assignee: Etownip Microelectronics (Beijing) Co., LTD., Beijing (CN)

( * ) Notice: Subject to any disclaimer, the term of this patent is extended or adjusted under 35 U.S.C. 154(b) by 57 days.

(21) Appl. No.: 17/417,149

(22) PCT Filed: Dec. 10, 2019

(86) PCT No.: PCT/CN2019/124217
§ 371 (c)(1),
(2) Date: Jun. 22, 2021

(87) PCT Pub. No.: WO2020/135012
PCT Pub. Date: Jul. 2, 2020

(65) Prior Publication Data
US 2022/0051903 A1  Feb. 17, 2022

(30) Foreign Application Priority Data
Dec. 28, 2018 (CN) .......................... 201811620602.1

(51) Int. Cl.
*H01L 21/311* (2006.01)
*H01L 21/463* (2006.01)

(52) U.S. Cl.
CPC ...... *H01L 21/31116* (2013.01); *H01L 21/463* (2013.01)

(58) Field of Classification Search
None
See application file for complete search history.

(56) References Cited

U.S. PATENT DOCUMENTS

| | | | |
|---|---|---|---|
| 6,777,340 B1 * | 8/2004 | Chiu | H01L 21/3081 438/719 |
| 6,828,248 B1 * | 12/2004 | Tao | H01L 21/76232 257/E21.549 |
| 8,133,817 B2 * | 3/2012 | Sasano | H01L 21/3065 438/738 |
| 2006/0011575 A1 * | 1/2006 | Chung | H01L 21/31144 257/E21.252 |

* cited by examiner

*Primary Examiner* — Stephanie P Duclair
(74) *Attorney, Agent, or Firm* — Xinsheng Wang, Patent Attorney

(57) ABSTRACT

A method for preparing precise pattern of integrated circuits, which comprises the following steps: (S1) preparing a large pitch trench or circular through-hole structure with a hard mask in a first dielectric layer by lithography and etching; (S2) forming micro trench on the hard mask of the second dielectric layer at the bottom side wall of the trench or circular through-hole structure by plasma etching process; (S3) removing the first dielectric layer; (S4) opening the hard mask of the second dielectric layer at the micro trench formed on the hard mask of the second dielectric layer by plasma etching process; (S5) small pitch trench or circular through holes are prepared in the second dielectric layer.

9 Claims, 5 Drawing Sheets large pitch trench or circular through-hole structures with hard mask are fabricated in the first dielectric layer by lithography and etching; — S1 forming micro trench on a hard mask of a second dielectric layer at the bottom side wall of the trench or circular through-hole structures by a plasma etching process; — S2 removing the first dielectric layer; — S3 opening the hard mask of the second dielectric layer at the micro trench formed on the hard mask of the second dielectric layer by plasma etching process; — S4 small pitch trench or circular through-hole structure is prepared in the second dielectric layer. — S5

PREPARATION METHOD FOR ACCURATE PATTERN OF INTEGRATED CIRCUIT

RELATED APPLICATIONS

This application is the United States National Phase of International Application PCT/CN2019/124217, filed Dec. 10, 2019, which claims the benefit of Chinese Application No. 201811620602.1, filed Dec. 28, 2018. The entire of which is specifically incorporated by reference in its entirety herein.

FIELD

The disclosure belongs to the field of microelectronic integrated circuits, and relates to the precision pattern transfer technology in the manufacturing of integrated circuit chips, in particular to a precision pattern preparation method when the integrated circuit chips need to carry out pattern preparation in the multiple exposure technology.

BACKGROUND

In the field of integrated circuit and chip manufacturing, some chips need to transfer the design layout to silicon through a large number of pattern transfer process. Pattern transfer technology is a technology that mainly uses the principle of optical chemical reaction and chemical and physical etching methods to transfer circuit pattern to the surface of single crystal or dielectric layer to form an effective pattern window or functional pattern. With the feature size of integrated circuits getting smaller and smaller, when the mainstream 193 nm wavelength light source is used for lithography, multiple exposure technology is needed to transfer the pattern with a pitch of more than 50 nm. The international mainstream gradually uses double exposure technology to expose the key layer pattern from the 32 nm technology node. At present, there are 14 nano-technology nodes of advanced mainstream technology, and the number of double exposure layers is more than 10.

The idea of dual imaging is to separate the images into two batches. For double exposure, it needs to first expose a batch of lines, and then move the exposure pattern to the adjacent place before performing other process steps to expose the second batch of lines. The double exposure is carried out on the same photoresist, but using different masks. Although the speed of double exposure is faster than that of double patterning, the key is to find a kind of nonlinear photoresist, which can absorb weak light from adjacent exposures without forming a pattern. Double exposure technology is an alternative to EUV (extreme ultraviolet lithography). Simply put, it's one etching, one cleaning, and then one etching. The purpose of this technology is to solve the problem of insufficient depth of EUV. Traditional exposure can use this technology, but the double exposure challenge are cleaning and interface. Because the bottom surface cleaned after the first etching is absolutely impossible to be flat, which will greatly affect the quality of the second etching. In addition, DP (double patterning) technology is more suitable for processing pattern with obvious cycle, and it is still very difficult to shape some image shapes in practical application. For example, the via structure used to connect the circuits of each layer in the circuit is difficult to be fabricated by DP technology because its distribution is usually not periodic. More importantly, the cost of implementing DP technology is very high. This is because in the process of high-end chip manufacturing, the construction and operation cost of photolithography process in the whole production line is nearly half. Please refer to "complete book of integrated circuit industry, written by Wang Yangyuan, electronic industry press, published in 2018, 938-940".

At present, there are two mainstream double exposure technologies: LELE (lithography, etching, lithography, etching) and SADP (self-aligned double exposure). The cost and technical complexity of double and multiple exposures are the main bottlenecks of Moore's Law. Traditional image conversion with reduced pitch is achieved by double exposure and multiple exposure. However, with each additional exposure process, the cost of the pattern transfer process needs to be doubled. In order to achieve smaller pitch in the key layer of high-end chip, the manufacturing cost index of high-end chip increases with multiple exposure. Professor TSU-Jae King Liu, Dean of the school of technology at the University of California Berkeley, invented a technology of "hard mask preparation by inclined ion implantation", which can replace the double patterning technology, and the cost can be greatly reduced.

SUMMARY

The purpose of the invention is to provide a method for preparing precise pattern of integrated circuit by using plasma characteristics, aiming at the defect of high cost of double exposure or multiple exposure process in the prior art, which is used to prepare small pitch hard mask structure, simplify the process flow and reduce the manufacturing cost.

The technical solution of the invention is as follows: A method for precision pattern preparation of integrated circuits comprises the following steps:

(S1) large pitch trench or circular through-hole structures with hard mask are fabricated in the first dielectric layer by lithography and etching;

(S2) forming micro trenches on a hard mask of a second dielectric layer at the bottom side wall of the trench or circular through-hole structure by a plasma etching process;

(S3) removing the first dielectric layer;

(S4) opening the hard mask of the second dielectric layer at the micro trench formed on the hard mask of the second dielectric layer by plasma etching process;

(S5) a small pitch trench or circular through-hole structure is prepared in the second dielectric layer.

Further, the method for preparing precise pattern of integrated circuit described above, wherein the first dielectric layer and the second dielectric layer can be SiO2, SiN or other non-conductors.

Further, the method for preparing precise pattern of integrated circuit as described above, wherein the aspect ratio of the trench or circular through hole prepared in the first dielectric layer in step (S1) is greater than or equal to 2.

Further, the method for preparing precise pattern of integrated circuit described above, wherein in step (S2), plasma with high density and high ionization rate is used for etching, and the etching gas is fluorine-based discharge gas; The fluorine-based discharge gas is a mixture of fluorine-based gas and argon gas.

Furthermore, in step (S2), the input RF power of plasma etching is 1-10 kw, the electron temperature of plasma is 1-10 ev, the plasma density is $10^{15}$-$10^{18}$/m$^3$, and the ionization rate is $10^{-7}$-$10^{-4}$.

Further, the method for preparing precise pattern of integrated circuit described above, wherein the micro trench is strengthened to generate by adjusting the aspect ratio of the trench or circular through hole in step (S1), and adjusting the electron temperature of the plasma in step (S2).

Further, the method for preparing precise pattern of integrated circuit described above, wherein the first dielectric layer is removed by either chemical mechanical grinding process in step (S3) or plasma etch batch with the Bar filled in trench or hole.

Further, the method for preparing precise pattern of integrated circuit described above, wherein the fluorine-based plasma etching process is adopted in step (S4).

Further, the method for preparing precise pattern of integrated circuit described above, wherein the small pitch in step (S5) is more than ⅓ smaller than the large pitch in step (S1).

Furthermore, the method for preparing precise pattern of integrated circuit described above, wherein the operation steps of the method can be repeated for many times to further reduce the pitch of the integrated circuit pattern.

The beneficial effects of the invention are as follows: the method of using plasma characteristics to prepare integrated circuit precise pattern proposed in the invention can control and optimize the shape of etching profile by adjusting plasma process parameters, which has simple process and low cost, and is conducive to the application and promotion of high-end chips. Usually, the hard mask with pitch reduction of more than ⅓ can be fabricated by using the existing process equipment on the chip production line and optimizing the modulation of process parameters, so as to realize the pattern transfer with reduced pitch.

BRIEF DESCRIPTION OF THE DRAWINGS

In order that the manner in which the above-recited and other enhancements and objects of the disclosure are obtained, a more particular description of the disclosure briefly described above will be rendered by reference to specific embodiments thereof which are illustrated in the appended drawings. Understanding that these drawings depict only typical embodiments of the disclosure and are therefore not to be considered limiting of its scope, the disclosure will be described with additional specificity and detail through the use of the accompanying drawings in which.

DETAILED DESCRIPTION

The invention is further described in detail in combination with the drawings and specific embodiments.

The invention provides a method for manufacturing fine trench or circular through holes in a dielectric by using plasma characteristics. In the plasma etching process, due to the shell voltage effect of plasma, some tiny trenches are often generated at the bottom. By adjusting the plasma process parameters, the shape of the optimized etching profile can be controlled. Refer to "plasma discharge principle and material treatment, Michael A. Lieberman & Allan J. Lichtenberg, translated by Pu Yikang, China Science Press, 2007, p. 40.

Figure 2:
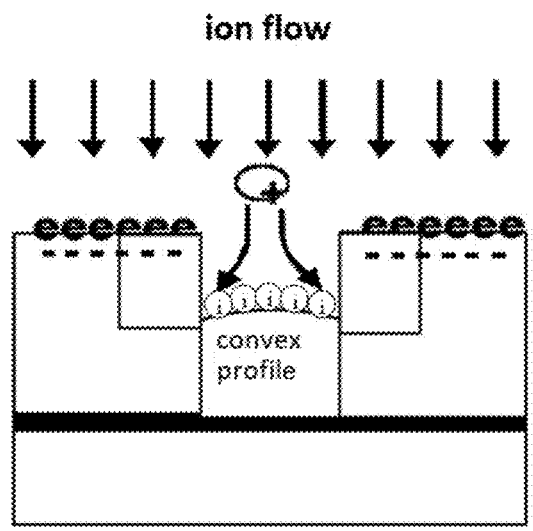
FIG. 2 shows the mechanism of micro trench produced by plasma etching.

Referring to the situation shown in FIG. 2 as an example, the main mechanism of the plasma etching process to form the profile shape shown in FIG. 2 is that during the plasma etching process, a large number of negative electrons e will accumulate on the surface of the dielectric, and ions I will tend to accumulate at the bottom of the trench or through hole, resulting in the trajectory shift of the positive ions of the etching plasma to be anisotropic when bombarding the dielectric. The ion bombardment flux near the side wall is much larger than that in the middle region. The plasma etching rate near the side wall is much higher than that in the middle region. As a result, a convex bottom profile is formed as shown in FIG. 2. According to the relevant research, the formation degree of the convex bottom profile is related to the aspect ratio of the trench and the electron temperature of the plasma.

Figure 3:
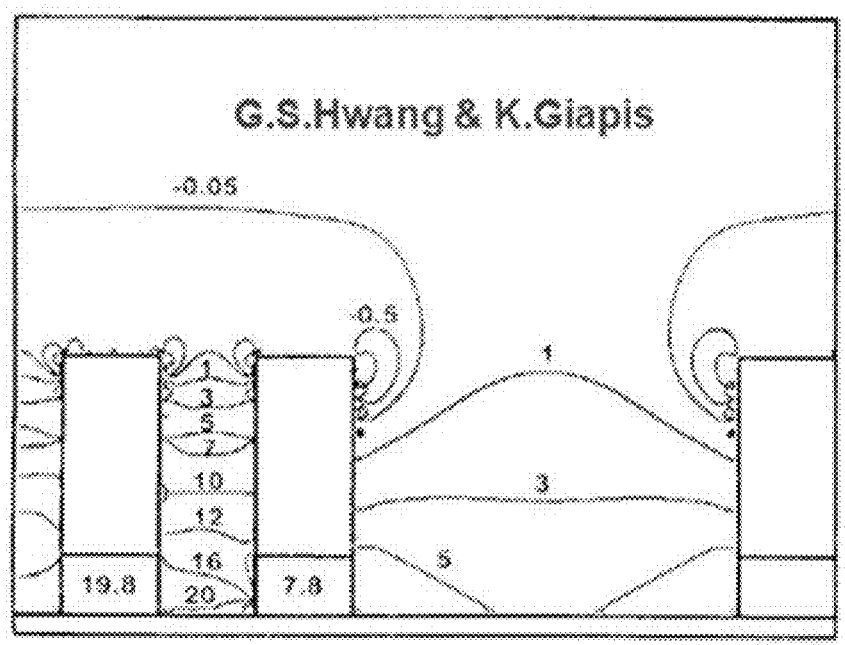
FIG. 3 shows the relationship between the aspect ratio and the voltage distribution of the trench.

The aspect ratio of the trench is the ratio of the depth of the trench to the width of the trench. In the plasma etching process, the size of the aspect ratio determines the spatial voltage distribution. As shown in FIG. 3, a higher aspect ratio can produce a larger voltage difference. In FIG. 3, the width of the left trench is smaller than that of the right trench, and the depth of the two is the same. Therefore, the aspect ratio of the left trench is obviously larger than that of the right trench. According to the voltage distribution shown in FIG. 3, the difference between the bottom voltage and the top voltage of the left trench is about 20V, while the difference between the bottom voltage and the top voltage of the right trench is only about 5V. It means that a higher aspect ratio can produce a larger voltage difference, which makes the ions tend to bombard the part near the side wall at the bottom of the trench, and aggravate the generation of micro trenches at the side wall.

Figure 4:
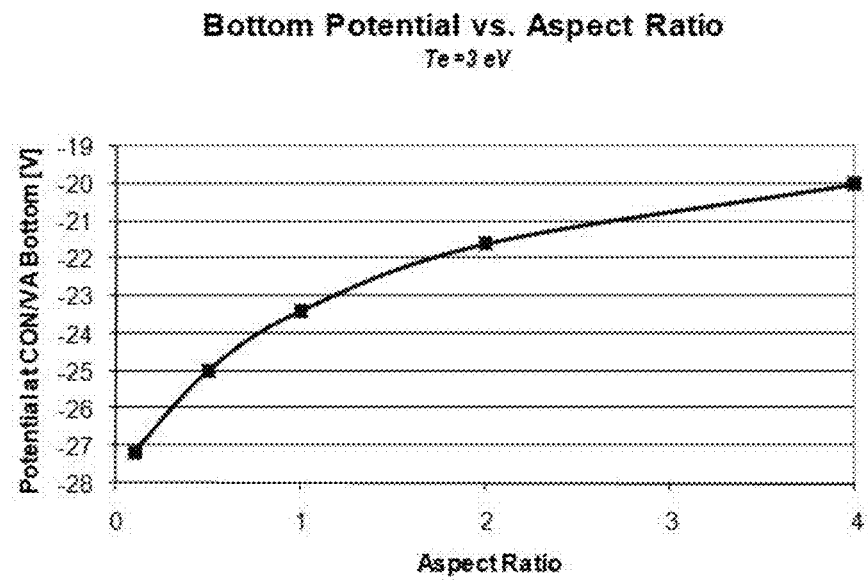
FIG. 4 shows the relationship between the aspect ratio of the trench and the voltage value; In the figure, when the electron temperature is 3 eV and the aspect ratio of the trench is 4, the bottom voltage is −20V.

By theoretical calculation, FIG. 4 shows that the voltage on the surface of the dielectric is about −28V when the electron temperature is 3 eV, and the voltage on the bottom is −20V when the aspect ratio of the trench is 4. Refer to "Wu Han Ming, Kuang Ya Lei," Research on the charge effect in the double inlay etching process of 0.13 μm copper wire technology, special equipment for electronic industry, Vol. 32, No. 06, 2003.

According to the above theoretical analysis, the invention proposes a method for preparing precise pattern of integrated circuit. The method utilizes the above characteristics of plasma etching process. By adjusting the electron temperature of plasma and the aspect ratio of etching profile, the enhanced convex bottom profile as shown in FIG. 2 can be obtained in the trench of dielectric. The plasma electron temperature is determined by the pressure, RF power characteristics and plasma chemical composition.

Figure 1:
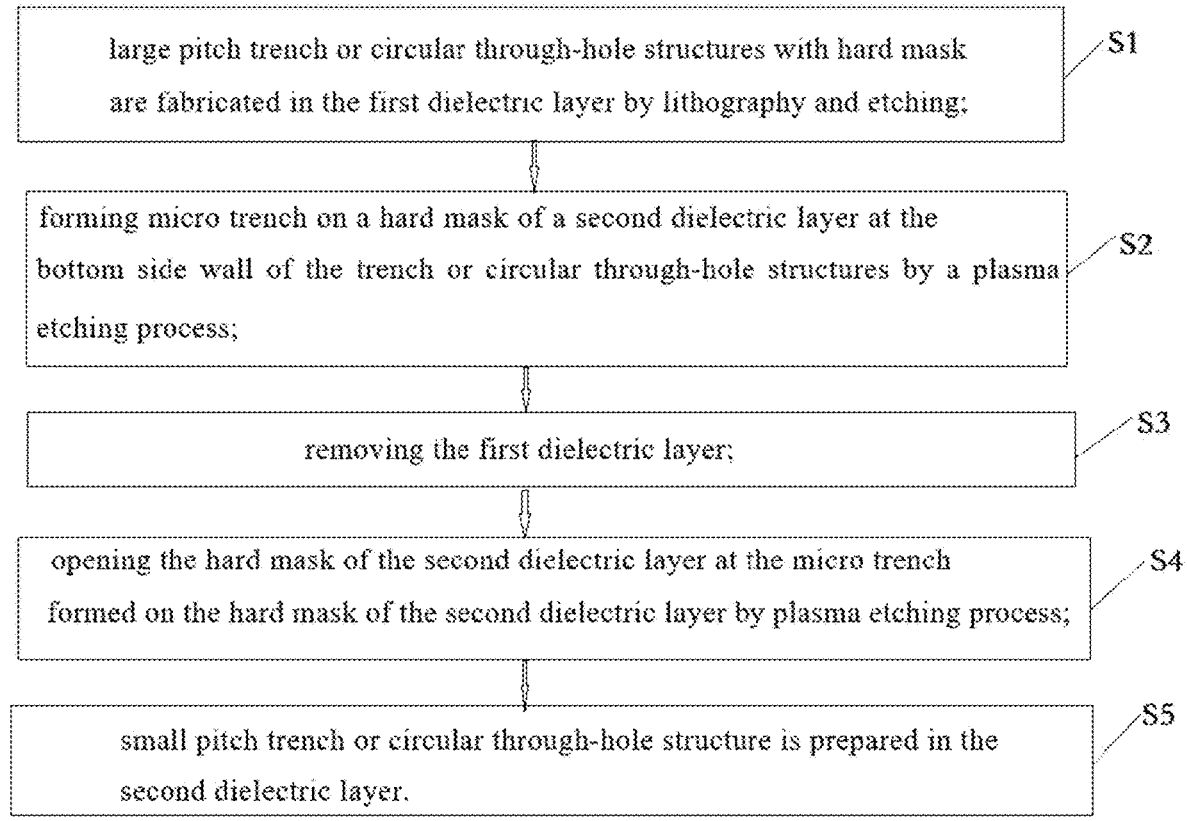
FIG. 1 is a flow chart of the integrated circuit precision pattern preparation method of the present invention.

As shown in FIG. 1, a method for preparing precise pattern of integrated circuit provided by the invention comprises the following steps:

(S1) according to the traditional pattern transfer technology, large pitch trench or circular through-hole structure with hard mask is fabricated in the first dielectric layer by lithography and etching;

(S2) forming micro trenches on a hard mask of a second dielectric layer at the bottom side wall of the trench or circular through-hole structure by a plasma etching process;

(S3) removing the first dielectric layer;

(S4) opening the hard mask of the second dielectric layer at the micro trench formed on the hard mask of the second dielectric layer by plasma etching process;

(S5) a small pitch trench or circular through-hole structure is prepared in the second dielectric layer.

The dielectric of this method can be SiO2, SiN or other non-conductors. Plasma etching needs high density and high ionization rate plasma. The input RF power of plasma etching is 1-10 kw, the electron temperature of plasma is 1-10 ev, the plasma density is $10^{15}$-$10^{18}$/m$^3$, the ionization rate is $10^{-7}$-$10^{-4}$, and the etching gas is fluorine-based discharge gas (mixture of fluorine-based gas and argon). In the plasma etching process, the aspect ratio of the trench determines the voltage distribution in the space. Therefore, the aspect ratio of the large pitch trench or circular through hole prepared in the first dielectric layer can be greater than or equal to 2, and the plasma electron temperature can be in the range of 1-10 ev. The pitch of the trench or circular through hole prepared by the method in the second dielectric layer can be reduced by more than ⅓ compared with the pitch of the trench or circular through hole formed in the first dielectric layer.

The most important feature and effect of the above method is that the process is simple and the cost is low, which is conducive to the application and promotion of high-end chips. Generally, the hard mask with significantly reduced pitch can be prepared by relying on the existing process equipment on the chip production line and optimizing and adjusting the process parameters. Repeating the above method can further reduce the pitch of the figure.

FIGS. 5A-5E shows a process flow for manufacturing a small pitch trench in a dielectric according to a specific embodiment of the present invention.

Figure 5A:
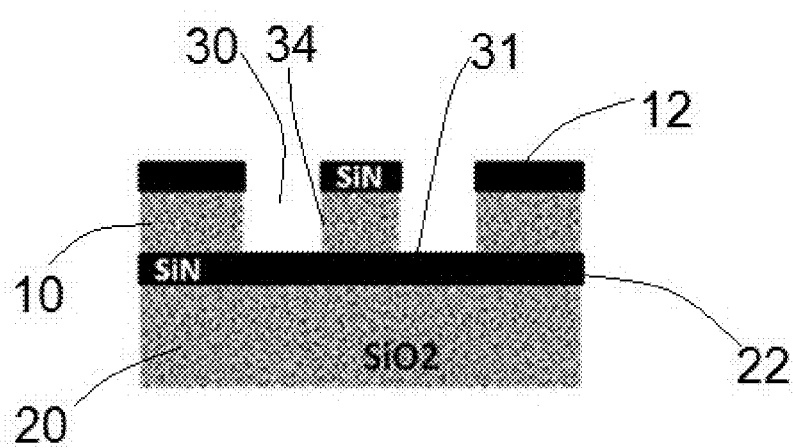
FIG. 5A shows the first step of the preparation process flow of the small pitch trench in the specific embodiment of the invention.

In the example of FIGS. 5A-5E, the thickness of SiN material as the hard mask of the dielectric can be 30-50 nm, and the pitch of the pattern in the initial process can be about 80 nm. The profile in FIG. 5 is obtained by high density plasma etching. Finally, the hard mask structure with pitch reduced by ⅓ is fabricated by etching with isotropic plasma or diluted HF solution. The specific process is as follows:

Step 1: referring to FIG. 5A, according to the traditional pattern transfer technology, a first pitch trench or circular through-hole structure 30 with a first SiN hard mask 12 (about 50 nm) was prepared in the first dielectric layer 10 of SiO$_2$ by lithography and etching. The bottom 31 of the trench or circular through hole structure 30 is a second SiN hard mask 22 of the second dielectric layer 20. In this embodiment, the aspect ratio (the ratio of the depth 33 of the trench to the width 32 of the trench) of trench or circular through hole is 4.

Figure 5B:
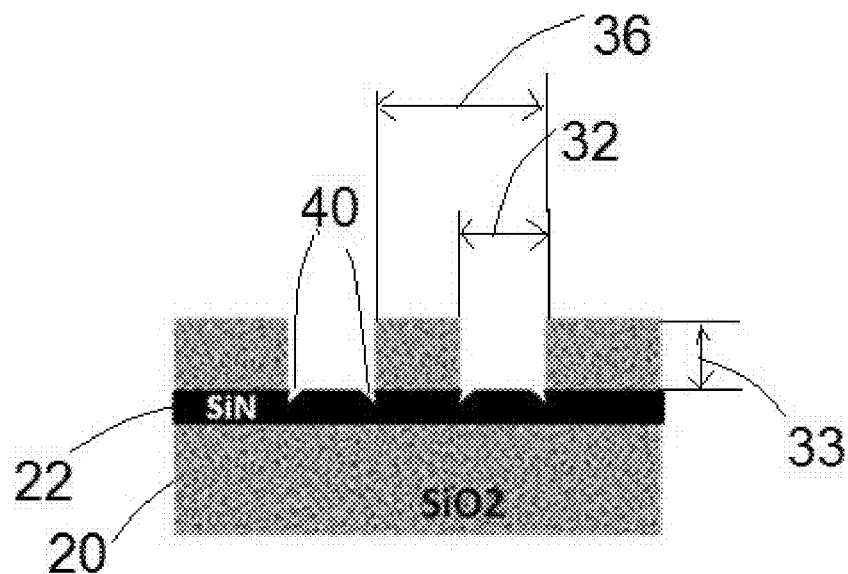
FIG. 5B shows the second step of the preparation process flow.

Step 2: referring to FIG. 5B, to form convex trenches 40 on the bottom side walls 31 of the first trenches or circular through holes structure 30 in the first dielectric layer by plasma etching process with high density ($10^{15}$/M$^3$<Nelectron<$10^{18}$/M$^3$) and high ionization rate ($10^{-7}$<Rioniz<$10^{-4}$). Each of the convex trench is formed around the SiN hard mask 22 of the second dielectric layer 20, such that the profile of the SiN hard mask of the second dielectric layer has a convex shape as shown in the figure. In this step, fluorine-based discharge gas (mixture of fluorine-based gas and argon gas) is used for plasma etching. The input RF power is 5 kW, the electron temperature of plasma is above 3 eV, and the plasma density is about $10^{17}$/m$^3$.

Figure 5C:
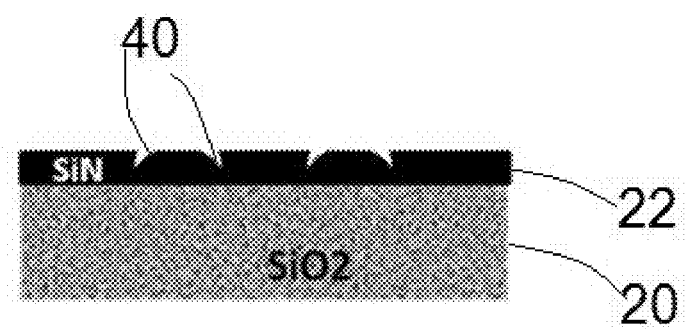
FIG. 5C shows the third step of the preparation process flow.

Step 3: referring to FIG. 5C, using chemical mechanical polishing (CMP) technology to remove the first dielectric layer 10 of SiO$_2$ to form a planar hard mask prototype of SiN.

Figure 5D:
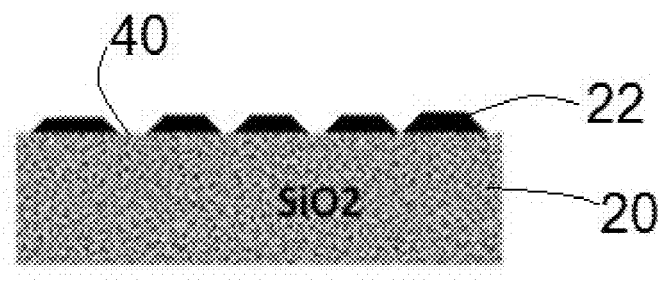
FIG. 5D shows the fourth step of the preparation process flow.

Step 4: referring to FIG. 5D, through the fluorine-based plasma etching process, the SiN hard mask is opened at the convex trench 40 formed on the second SiN hard mask 22 of the second dielectric layer 20, where the pitch of the hard mask is significantly smaller than that formed on the SiN hard mask of the first dielectric layer in the first step. SF6 or CF$_X$ discharge gas can be used in the fluorine-based plasma etching process, and small amount of argon (about 2%) can be added. The desired effect can be achieved by adjusting the substrate bias appropriately.

Figure 5E:
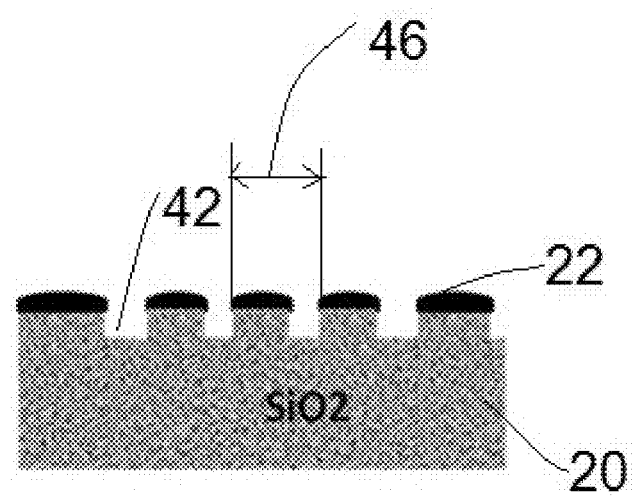
FIG. 5E shows the fifth step of the preparation process flow.

Step 5: referring to FIG. 5E, using the plasma etching process or diluted HF solution etching similar to the Step 1, the second pitch trench or circular through-hole structure 42 is obtained, and the second pitch 46 of the second pitch trench reduce more than ⅓ of the first pitch 36 of the first pitch trench in the Step 1, so as to realize the pattern conversion of reduced pitch.

Obviously, those skilled in the art can make various changes and variations to the invention without departing from the spirit and scope of the invention. In this way, if these modifications and variations of the invention fall within the scope of the claims of the invention and their equivalents, the invention is also intended to include these modifications and variations.

What is claimed is:

1. A method for preparing precise pattern of integrated circuit, comprising the steps:
    (S1) fabricating a plurality of first pitch trench or circular through-hole structures with a first hard mask in a first dielectric layer by lithography and etching;
    (S2) forming convex trenches on a second hard mask of a second dielectric layer at a bottom side wall of the plurality of first pitch trench or circular through-hole structures by a plasma etching process;
    (S3) removing the first dielectric layer;
    (S4) opening the second hard mask of the second dielectric layer at the convex trenches;
    (S5) preparing a plurality of second pitch trench or circular through-hole structures in the second dielectric layer;
    wherein the production of the micro trench is enhanced by adjusting the aspect ratio of the trenches or circular throughs in step (S1), and adjusting the electron temperature of the plasma in step (2).

2. The method of claim 1, wherein the first dielectric layer and the second dielectric layer are SiO$_2$, SiN or other non-conductors.

3. The method of claim 1, wherein each of aspect ratio of the trench or circular through hole structures is greater than or equal to 2.

4. The method of claim 1, wherein plasma with high density and high ionization rate is used for etching in step (2), and an etching gas used in the plasma etching process is fluorine-based discharge gas; the fluorine-based discharge gas is a mixture of fluorine-based gas and argon gas.

5. The method of claim 4, wherein an input RF power of plasma etching in step (S2) is 1-10 kw, the plasma electron temperature is 1-10 ev, the plasma density is $10^{15}$-$10^{18}$/m$^3$, and the ionization rate is $10^{-7}$-$10^{-4}$.

6. The method of claim 1, wherein the first dielectric layer is removed by chemical mechanical grinding process in step (S3).

7. The method of claim 1, wherein a fluorine-based plasma etching process is adopted in step (S4).

8. The method of claim 1, wherein a second pitch of each of the second pitch trench or circular through-hole structures reduce more than ⅓ of a first pitch of each of the first pitch trench or circular through-hole structures.

9. The method of claim 1, wherein the steps of the method can be repeated several times to further reduce a pitch of the integrated circuit pattern.

\* \* \* \* \*